United States Patent [19]

Brickley et al.

[11] Patent Number: 4,747,020

[45] Date of Patent: May 24, 1988

[54] WIRE DISTRIBUTION APPARATUS

[75] Inventors: Patrick Brickley, Long Lake; Larry Gonier, Inver Grove Heights; James Dewey, Plymouth; Karl H. Pohl, Buffalo, all of Minn.

[73] Assignee: ADC Telecommunications, Inc., Minneapolis, Minn.

[21] Appl. No.: 864,023

[22] Filed: May 16, 1986

[51] Int. Cl.[4] ............................................. H02B 1/02
[52] U.S. Cl. ................................. 361/428; 361/429; 379/327; 379/329
[58] Field of Search .................... 339/198 R; 361/119, 361/390–394, 428, 429; 379/327, 329

[56] References Cited

U.S. PATENT DOCUMENTS

| | | |
|---|---|---|
| 2,983,892 | 5/1961 | Williams et al. . |
| 2,986,675 | 5/1961 | Burson et al. . |
| 3,148,311 | 9/1964 | Conway et al. . |
| 3,566,190 | 2/1971 | Huebner . |
| 3,643,205 | 2/1972 | Elkins . |
| 3,772,635 | 11/1973 | Frey et al. . |
| 3,778,750 | 12/1973 | Caveney et al. . |
| 3,852,539 | 12/1974 | De Luca . |
| 3,860,318 | 1/1975 | Reavis, Jr. et al. . |
| 4,002,856 | 1/1977 | Sedlacek . |
| 4,012,672 | 3/1977 | Douglass et al. . |
| 4,131,772 | 12/1978 | Weckenmann et al. . |
| 4,150,867 | 4/1979 | Knickerbocker . |
| 4,152,750 | 5/1979 | Bremenour et al. . |
| 4,158,754 | 6/1979 | Yonezaki . |
| 4,160,574 | 7/1979 | DeRoss . |
| 4,204,095 | 5/1980 | De Luca et al. . |
| 4,210,379 | 7/1980 | Vachhani et al. . |
| 4,215,386 | 7/1980 | Prager et al. . |
| 4,236,778 | 12/1980 | Hughes et al. . |
| 4,255,009 | 3/1981 | Clark . |
| 4,345,294 | 8/1982 | Forberg et al. . |

FOREIGN PATENT DOCUMENTS 2621101 11/1977 Fed. Rep. of Germany .

Primary Examiner—A. D. Pellinen
Assistant Examiner—Gregory D. Thompson
Attorney, Agent, or Firm—Merchant, Gould, Smith, Edell, Welter & Schmidt

[57] ABSTRACT

A wire distribution apparatus is disclosed having a frame member with walls defining a vertical open face chamber. A plurality of termination modules are secured to the frame in side-by-side relation. Each of the modules includes a pair of opposing panels having one end pivotally mounted to the frame on opposite sides of the vertical chamber opening and pivotable between a first position with panels joined to form prismatically shaped termination modules. The panels are also pivotable to a second position with opposing panels pivoted away from one another to expose the openings in the frame to provide access to cables and wiring within the frame. Tie bar mechanisms are provided for rigidly securing panels in open positions.

10 Claims, 4 Drawing Sheets

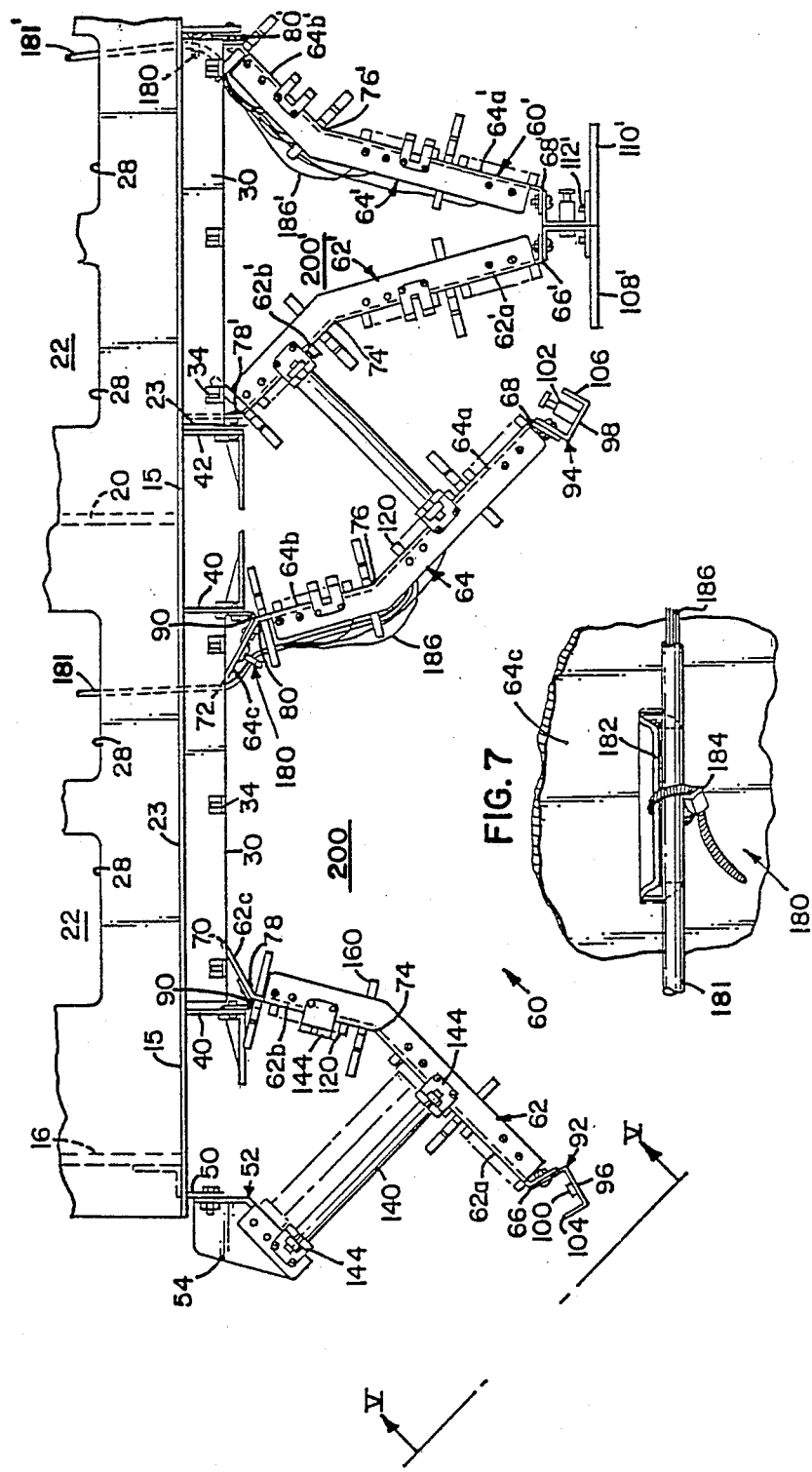

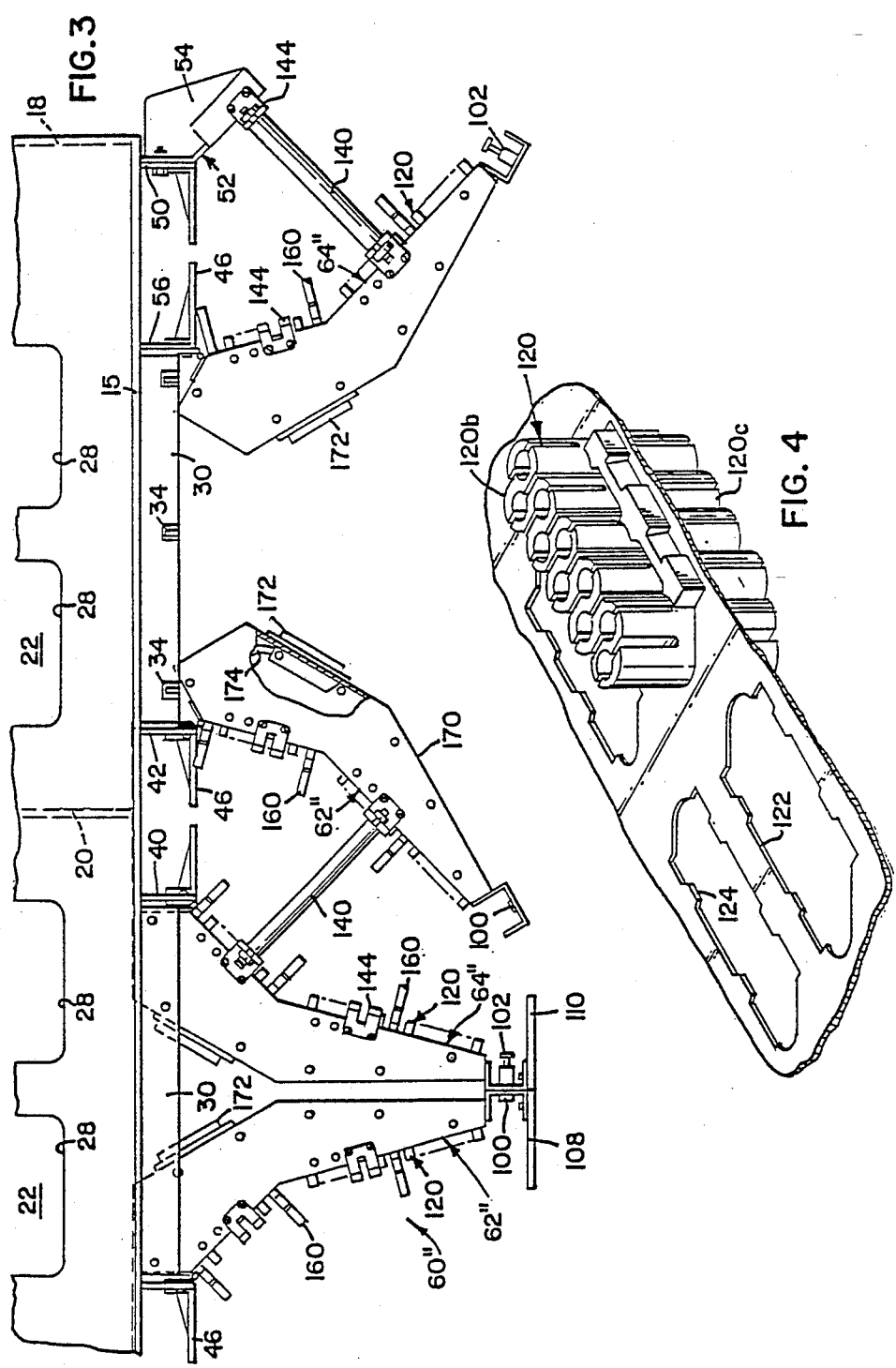

WIRE DISTRIBUTION APPARATUS

BACKGROUND OF THE INVENTION

I. Field of the Invention

This invention pertains generally to the field of telecommunications and, more particularly, to apparatus for distributing wires or cross connecting telecommunication lines.

II. Description of the Prior Art

Wire distribution apparatus are widely used in the telecommunications industry to interconnect equipment lines and distribution lines. Historically, wire distribution apparatus consisted of a planar array of connection terminals. minals.

As the number of termination requirements for an installation increases, the surface area required for the connection terminals increases. In order to control costs associated with wire distribution apparatus, it is desirable to minimize the space requirements for the apparatus by achieving a high density of wire termination points. To this end, electrical connectors have been invented which are closely packed and facilitate ready installation of wires. An example of such a connector is shown in commonly assigned U.S. Pat. No. 4,688,872 entitled "Electrical Connector Module with Multiple Connector Housings". Also, the design of wire distribution apparatus has evolved to achieve a higher density of termination points for given area of wall space. An example of such an enhanced design is shown in co-pending commonly assigned U.S. patent application Ser. No. 664,990 filed Oct. 26, 1984 and entitled "Modular Distribution Frame". In the latter mentioned U.S. patent application, the distribution apparatus includes prismatic shaped termination modules having contoured panels which provide for greatly increased density of wire terminations. The termination module panels are ergonometrically shaped to facilitate rapid installation of cross-connect wires.

As a result of the advances in the art provided by the aforesaid patent applications, a remarkably improved density of termination connectors has been achieved in a structure which, due to its design, facilitates rapid installation of cross-connect wires. However, a common difficulty encountered with a wire distribution apparatus such as that shown in U.S. patent application Ser. No. 664,990, as well as other prior art wire distribution apparatus, is the difficulty involved in changing terminal connections of cable wires. For example, in the structure shown in the aforesaid application, the termination modules are prisms having hollow interiors. Before the modules are mounted on the frame member, cables are installed. With cables installed, the module is mounted on the frame and the cross-connect wires are installed. To subsequently change the connections of the cables requires removal of the module and may require disconnect of the cross-connect wires. This is a cumbersome and time consuming procedure which is also a burden with the other prior art wire distribution apparatus.

Notwithstanding advances previously made in the art, there is a continuous need for further advances to maintain a high density of connector terminals per square foot of building wall space. Also, there is a recognized need to provide easy access to cables to modify their connections after cross-connect wires have been installed.

SUMMARY OF THE INVENTION

According to a preferred embodiment of the present invention, a wire distribution apparatus is provided having a frame member with walls defining a chamber sized to receive a plurality of cables. A plurality of termination modules are secured to the frame in side-by-side relation with each of the termination modules having first and second termination panel. The termination panels are detachably joined at a common edge. The termination panels extend from the common edge to hinge locations. At the hinge locations, the termination panels are each hinged to the frame member in spaced relation. The interior of the termination module is in communication with the cable receiving chamber of the frame member. A plurality of electrical connectors are carried by the panels with the electrical connectors having means for receiving cable wires from the chamber and terminating the cable wire on the electrical connector on the interior surface of the panels. On the exterior surface of the panels, the electrical connector is provided with means for terminating cross-connect wires to provide electrical connection between the cross-connect wires and the cable wires. Tie bar mechanisms are provided for rigidly and releasably connecting an open panel of one of said plurality of termination modules to an opposing closed panel of an adjacent termination module or to a support wing mounted on the frame.

BRIEF DESCRIPTION OF THE DRAWINGS

FIG. 2 is a top plan view of the wire distribution apparatus of the present invention showing a termination module in an open position and an adjacent termination module in a closed position;

FIG. 3 is a view similar to the view of FIG. 2 showing modified versions of termination modules;

FIG. 4 is a perspective view of an electrical connector mounted on the termination modules;

FIG. 7 is a perspective view of a cable attachment mechanism.

DESCRIPTION OF THE PREFERRED EMBODIMENT

Figure 1:
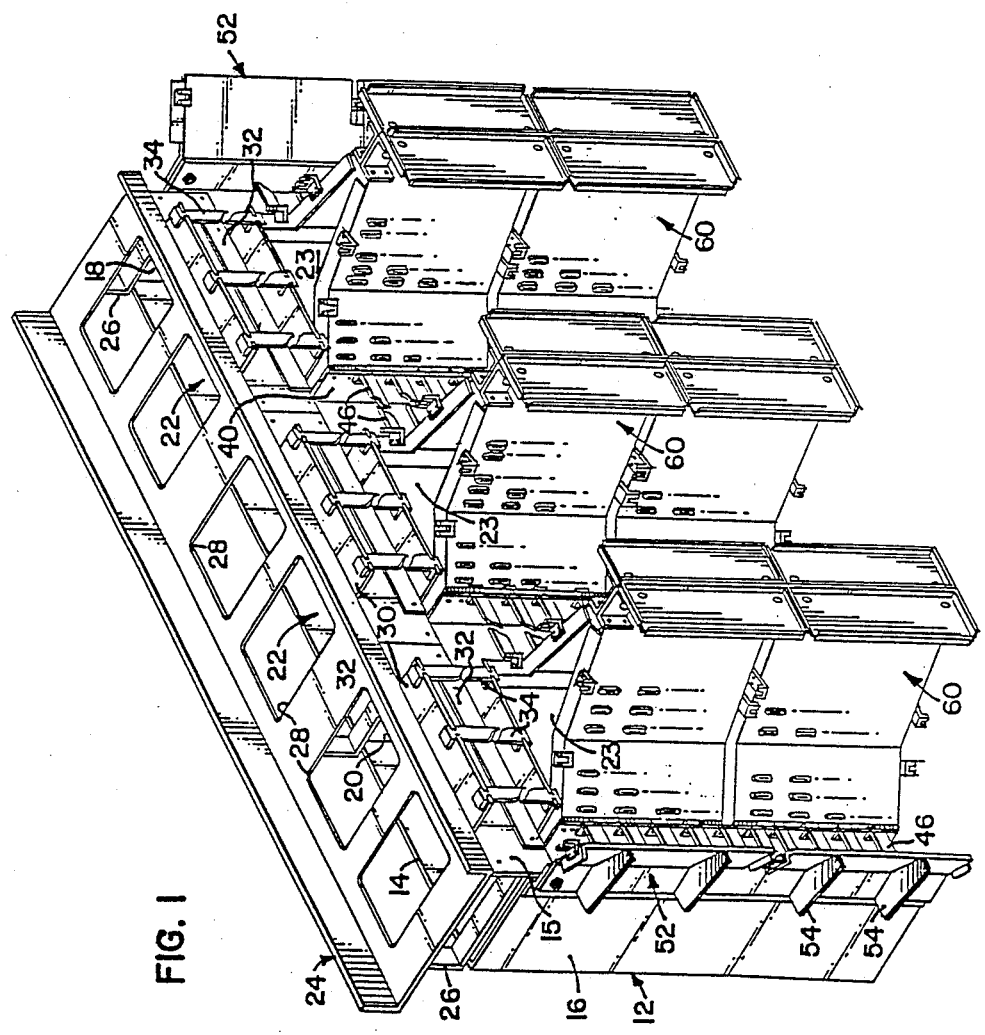
FIG. 1 is a perspective view of a wire distribution apparatus according to the present invention.

Referring to FIG. 1, a wall mounted wire distribution apparatus is shown. The apparatus includes a wall mounted frame member 12 having a back wall 14 and end side walls 16 and 18. Extending away from back wall 14 and disposed between end side wall 16 and 18 are a plurality of interior walls 20. Interior walls 20, end walls 16 and 18 and back wall 14 cooperate to define a plurality of vertically extending open face chambers or channels 22. The frame 12 has a forward face 15 with channel openings 23 exposing chambers 22 through face 15. A cable guide member 24 is mounted to frame 12 by means of mounting brackets 26 and is provided with a plurality of open passageways 28 in communication with chambers 22. Passageways 28 provide means for passing a plurality of cables through passageways 28 into chambers 22 for eventual cross connection with a plurality of cross-connect wires as will be described hereafter.

A plurality of aligned opposing horizontal plates 30 project perpendicularly away from the forward face 15 of the frame member 12. Opposing plates 30 define a plurality of aligned channels 32 which will serve to organize and guide cross-connect wires as will be described. Each of the plates 30 are provided with retaining clips 34 which project toward an opposing retaining clip 34 on an opposing plate 30. Opposing retaining clips 34 terminate at closely spaced apart free ends to define a plurality of slots through which wires may be passed into and out of chambers 32.

In addition to the plurality of horizontal plates 30, frame member 12 is provided with a plurality of vertical plates 40 (shown best in FIGS. 2 and 3) which are disposed projecting from forward. access face 15 on both sides of channel openings 23. opposing surfaces of vertical plates 40 of adjacent access openings 23 define a tical plates 40 of adjacent acces plurality of vertically extending open face channels 42 which further provide guideways to organize and direct cross-connect wires. Projecting from free ends of plates 40 into channels 42 are a plurality of retaining clips 46 with the free ends of opposing retaining clips 46 being closely spaced apart to define a plurality of slots through which wires may freely pass to be removed or inserted into channels 42. As described thus far, the structure of frame member 12 is like that of the rectangular frame 12 shown and described in U.S. patent application Ser. No. 664,990. On outer end walls 16 and 18 a pair of vertical flanges 50, 56 dare provided to define open face channels 52 between flanges 50, 56 and an opposing vertical plate 40.

In addition to the structure of the frame member shown in U.S. patent application Ser. No. 664,990, the frame member of the present invention includes a pair of vertical support wings 52 bolted to each of end flanges 50 with wings 52 flaring outwardly away from the frame member 12. Horizontal gussets 54 are provided on surfaces of the wings 52 opposite the frame member 12 to provide structural support to the wings 52.

A plurality of termination modules 60 are provided mounted to frame member 12 and covering access openings 23. As shown in FIG. 1, the termination modules 60 are disposed in an array consisting of two rows and three columns. It will be appreciated that the number of termination modules may be greater or less than that shown.

Figure 5:
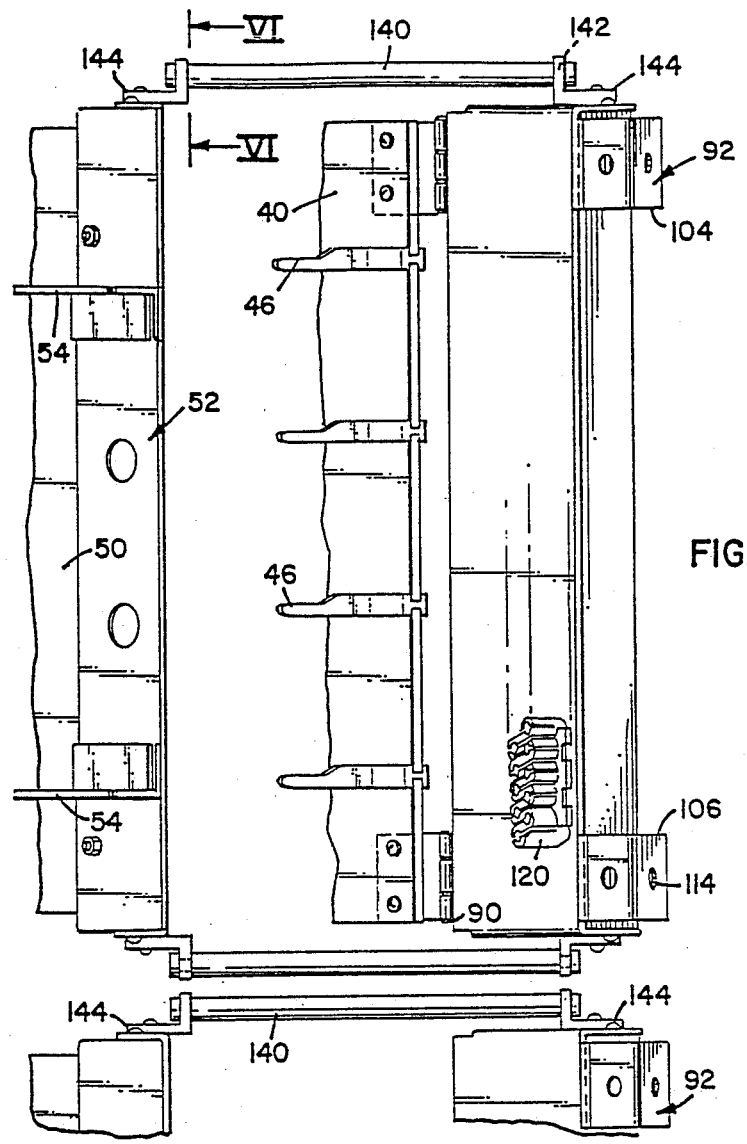
FIG. 5 is a view taken along line V—V of FIG. 2.

With particular references to FIGS. 1, 2 and 5, the termination modules of the present invention will now be described. In FIG. 2, two termination modules are shown. In the view of FIG. 2, the module 60 shown on the left side of the view is shown in an open position. Adjacent module 60 is a second termination module 60' shown in a closed position. Modules 60 and 60' are identical and corresponding elements of each will be numbered identically except with the addition of an apostrophe to identify the elements of module 60'. A description of module 60 will suffice as a description of module 60'.

Module 60 is formed from a pair of cooperating panel members including a first panel 62 and a second panel 64. Panels 62 and 64 are mirror images of one another and are generally planar with a first edge 66 and 68 extending to second edges 70 and 72, respectively. Panels 62 and 64 are respectively provided with first intermediate bends 74, 76 and second intermediate bends 78 and 80. Bends 74 and 78 occur across fold lines parallel to edges 70 and 66. Likewise, bends 76 and 80 occur across fold lines parallel to edges 68 and 72. Opposing surfaces of panels 62 and 64 define a module interior 200.

Shown best with respect to module 60', the first intermediate bends lines 74', 76' separate panels 62' and 64' into first segments 62a', 64a' and second segments 62b', 64b'. First bends 74' and 76' occur approximately two-thirds of the length of the panel from the leading edges 66' and 68' such that when the panels are joined to form a completed module, the completed module has a prismatic shape with a forward portion extending between edges 66' and 68' to bends 74' and 76' diverging at a first angle and then diverging at a more severe angle from bends 74', 76' to bends 78', 80'. As disclosed in U.S. patent application Ser. No. 664,990, this change in shape permits easy cross-connect wire terminations when panels 62', 64' are joined to form modules such as that shown as module 60'.

A blends 78, 80, panels 62 and 64 fold inwardly at an angle opposite to that of bends 74, 76 such that when the module 60 is formed to make its completed prismatic shape, portions 62c, 64c of the panels from bands 78, 80 to edges 70, 72 abuts against vertical plates 40. At bends 78, 80, panels 62, 64 are provided with a pair of hinges 90 having hinge plates secured to the panels and to the vertical plates 40. Hinges 90 are disposed for panels 62 and 64 to pivot at bends 78 and 80 at a generally vertical axis which is parallel to and spaced from leading edges 66 and 68. Accordingly, fold lines 78 and 80 act as pivot lines for panels 62 and 64, respectively.

Panels 62 and 64 are pivotal about their axes between first and second positions. The first position is shown by the panels 62', 64' where the panels cooperate to complete a prismatically shaped termination module 60'. The first edges 66, 68 of the panels 60 are provided with latching brackets 92 and 94, respectively, having opposing surfaces 96 and 98 such that when panels 62 and 64 are in the first position, surfaces 96 and 98 abut one another. Bracket 92 is provided with an internally threaded cap 100. Bracket 94 is provided with a captive screw 102 disposed to be aligned with the threaded bore of cap 100 when surface 96 abuts 98 such that screw 102 can be turned into the thread of cap 100 releasably joining edges 66 and 68 to form the completed termination module. Brackets 92 and 94 are also provided with mounting plates 104, 106 which extend perpendicularly away from surfaces 96, 98, respectively, such that when brackets 92 and 94 are joined, vertical plate members 108, 110 may be secured to the mounting brackets by means of quarter turn fasteners 112 received through holes 114 in plates surfaces 104, 106. In a preferred embodiment, the plate members 108, 110 will contain charts or other information indicating the wiring associated with the modules.

With the termination module so formed, a plurality of terminations of cross-connect wires can be performed on the module. The panels 62, 64 are provided with a plurality of electrical connectors 120. One such electrical connector 120 is shown in FIG. 4 and includes an integral housing having a plurality of split cylinder connectors (not shown) disposed in two offset rows. The connector 120 is locked into the surface of the panels and is received within openings 122. The panels have tabs 124 disposed to lock the connector 120 in place. The preferred connector as shown in FIG. 4 is more fully described in U.S. Pat. No. 4,688,872. With the connector 120 locked in place, the connector 120 presents a first side 120c projecting away from the inner surface of the panel receiving equipment wires from channels 22 and a second side 120b projecting away from the outer surface of the panel for receiving cross-connect wires from channels 32 and 42. For purposes of this application, opposing surfaces of panels 62 and 64 of the same module will be referred to as the inner surfaces. The opposite sides of the panels will be referred to as the outer surfaces. With the module 60' joined in its completed prismatic shape, cross-connect wires are readily inserted into side 120b of connector 120 through use of a tool such as that shown in commonly assigned U.S. patent application Ser. No. 830,979, filed Feb. 19, 1986 and entitled "Insertion Tool". Also shown in FIG. 2, the inner and outer surfaces of each of the panels 62, 64 are provided with a plurality of wire retaining clips 160 to guide and organize cable wires and cross-connect wires on the inner and outer surfaces, respectively, of the panels.

It will be appreciated that connector 120 is a preferred connector but other electrical connector apparatus could be carried by panel 62 and 64. It is intended that the present invention will include within its scope any panel such as panel 62 and 64 which includes electrical connection means for providing electrical connection between a plurality of cable wires and a plurality of cross-connect wires.

To effect electrical connection of the cable wires, screw 102 is released from cap 100 and the panels 62, 64 are readily pivotable about the axis defined by the hinges to the second position shown by module 60 in FIG. 2. With the panels 62, 64 pivoted, the interior of the module is exposed and access to channels 22 and their contained cables is possible. Connection can now be made between the cables and the now exposed second side 120c of connectors 120. However, it will be appreciated that in a preferred embodiment, a panel such as panel 62 will have numerous multiple connectors. For example, a panel may have up to sixty connectors such as connector 120 each having ten split cylinder connectors. As a result, up to 600 terminations can be performed on the inner surface of panel 62. Each one of these connections imparts a force on the panel. To accommodate these forces, rigid connecting means are provided.

Figure 6:
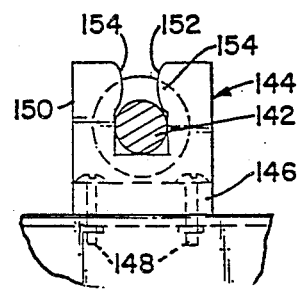
FIG. 6 is a view taken along line VI—VI of FIG. 5.

The rigid connecting means includes a tie bar 140 joining upper and lower edges of a panel in the second position to a fixed support. A plurality of tie bar retaining clips 144 are provided secured to the upper and lower edges of panels 62, 64. Shown best in FIG. 6, tie bar retaining clip 144 is formed of resilient plastic material and is L-shaped in cross section having a base portion 146 sized to be secured to the upper and lower edges of panels 62 and 64 by screws 148. The retaining clip 144 also has a vertical wall 150 having a slot 152 sized to receive a reduced diameter portion 142 of tie bar 140. A pair of opposing cam followers 154 are integrally formed with the clip and disposed within slot 152 such that the vertical wall 150 is deformed as the tie bar 140 is inserted permitting reduced diameter portion 142 to be moved in and out of the slot. When the reduced diameter portion 142 is received within the slot 152, the cam followers 154 retain the reduced diameter portion 142 to prevent it from falling out of the slot 152.

Wings 52 are also provided with retaining clips 144. As shown in FIGS. 2 and 3, panels 62, 64 of a module 60 which oppose panels of an adjacent module 60 are provided with two retaining clips 144 on the upper and lower edges of each of the panels. Specifically, each of the panels which oppose a panel of an adjacent module have a retaining clip 144 on the upper and lower edges of the panel segments 64a and 64b. When the panel is pivoted to its open position (such as panel 64 of module 60 in FIG. 2) tie bar 140 is inserted into connecting retaining clip 144 on panel segment 64a and retaining clip 144 on panel segment 62b' of module 60'. If it were desired to have terminal connections made on the inner surface of panel 62', panels 62 and 64 would be pivoted to their closed position and panel 62' would be pivoted to its open position. With the panel so positioned, a tie bar 140 would be inserted into connecting retaining clip 144 on panel segment 62a' and retaining clip 144 on panel segment 64b. Accordingly, each of the panels opposing a panel of an adjacent module has a retaining clip to receive a tie bar to support a panel of the opposing module in its open position. Also, each of such panels has a tie bar retaining clip to receive a tie bar to support the panel when it is to be maintained in an open position. When panels 62 or 64 at the ends of a row of modules are pivoted to their opening positions, the tie bar will connect retaining clips 144 on segments 62a or 64a to opposing retaining clips 144 on wings 52.

From the foregoing description, it can be seen that the prismatic shape of a completed module 60 has sufficient rigidity to withstand cross connection wire insertions. Through the novel structure of the present invention, the panels are pivotable to open positions to allow for rewiring of the cable wires. In the open position, the panels receive sufficient rigidity to withstand the wiring operation by reason of being tied to a structurally rigid prismatic module which is adjacent the open module during wiring.

As a panel moves back and forth between the first or closed position and the second or open position, wires connected to the outer surface of the panels flex to accommodate the movement. Organization of the wires is maintained by wire retaining clips 160 carried on the outer surface as well as the retaining clips 46 and 34 carried by frame 12. To prevent wires from being pulled loose from the inner surface of panels 62, 64, cable retention means 180 are provided. Most clearly shown in FIG. 7, cable retention means 180 each comprises a plurality of raised tab 182 formed on the inner surface of panel portions 62c and 64c. Preferably, each of panels 62, 64 is formed of sheet metal which, during its forming, is stamped present raised, taps 182. A plurality of cables, only two of which is shown as cable 181 and 181', are disposed passing through opening 28 into chambers 22. A cable is fastened to a tab placing the such as 181 adjacent the tab 182 and securing the cable 181 thereto by any suitable fastener such as flexible plastic strip fasteners 184 also referred to as cable ties. With the cable so secured, wires 186 from the cable 182 are inserted into sides 120a of connector 120.

The foregoing discussion has concentrated on the embodiment of FIG. 2 where each of the panels has a plurality of connectors 120. In the embodiment of FIG. 2 the individual wiring at each of the connectors 120 can be selectively varied on both the inner surface and the outer surface of the panels. An alternative embodiment is shown in FIG. 3 where each of the panels is provided with a rigid inner wall 170.

Elements of the module of FIG. 3 which are identical to the module of FIG. 2 are identically numbered except for the use of the double primed reference numbers. Mounted on inner wall 170 is an electrical connector 172 having a cable 174 of a plurality of wires which extends from the connector 172 and providing electrical connection between terminal points (not shown) of connector 172 and terminal locations of side 120c of connectors 120. In such an embodiment, cables disposed within chambers 22 will have terminal ends configured to mate with connector 172. Accordingly, the electrical connection between connectors 172 and sides 120c of connectors 120 are "hard-wired" or dedicated. As can be seen, the novel features of the present invention permit a great deal of versatility in design of a wire distribution apparatus while permitting access to cable connections and permitting change of cable connection wirings without the need for removal of the modules or other cumbersome and time consuming techniques.

From the foregoing detailed description of the present invention, it has been shown how the objects of the present invention have been attained in a preferred manner. However, modifications and equivalents of the disclosed concepts such as readily occur to those skilled in the art are intended to be included in the scope of this invention. Thus, the scope of the invention is intended to be limited only by the scope of the claims such as are, or may hereafter be, appended hereto.

What is claimed is:

1. A wire distribution apparatus comprising:
   a frame member having a plurality of opposing spaced apart walls defining a first chamber, said frame having an access face having openings in communication with said chamber;
   a termination module having a first panel and a second panel each extending between first and second edges and means detachably connecting first edges of said first and second panels, said second edges of said first and second panels spaced apart with opposing surfaces of said first and second panels defining a module interior;
   mounting means mounting said termination modules to said frame member with said module interior disposed in communication with at least one of said openings, said mounting means including fist pivot means pivotally connecting said first panel to said frame and second pivot means pivotally connecting said second panel to said frame with said first and second panels each pivotable between a first position with said first and second panels joined at said first edges and a second position with said first and second panels pivoted away from one another; and
   electrical connector means disposed on at least one of said first and second panels receiving a first plurality of electrical conductors extending through at least one of said openings from said first chamber and electrically connecting said first plurality of electrical conductors with a second plurality of electrical condutors extending exterior of said first chamber.

2. A wire distribution apparatus according to claim 1 comprising a plurality of said termination modules disposed on said frame in side-by-side relation with connecting means releasably rigidly conencting one of said first and second panels in the second position to a opposing one of first and second panels of an adjacent module when said opposing one of said first and second panels of said adjacent module is in a first position with first and second panels of said adjacent module joined.

3. A wire distribution apparatus according to claim 1 comprising means releasably rigidly connecting one of said first and second panels in the second position to said frame.

4. A wire distribution apparatus according to claim 2 wherein said connecting means comprises a tie bar of predetermined length and remaining means disposed on said first and second panels, said reatining means aligned to receive said tie bar to retain said one of said first and second panels in said second position and in rigid spaced relation from said opposing one of said first and second panels of said adjacent module.

5. A wire distribution apparatus according to claim 1 comprising retention means carried by at least one of said panels to retain a cable of said first plurality of electrical connectors with said cable traveling with at least one of said panels.

6. A wire distribution apparatus comprising:
   a frame member having a plurality of opposing spaced apart walls defining a chamber, said frame member having a generally vertically disposed access face with openings in communication with said chamber;
   a termination module having a first panel and a second panel, each of said panels having spaced apart first and second edges, means releasably joining said panels at said first edges to form a prismatic shape with said second edges spaced apart and with opposing surfaces of said panels defining a module interior;
   mounting means mounting said termination module to said frame member with said module interior in communication with at least one of said openings and with said first edges vertically disposed; said mounting means including first pivot means pivotally connecting said first panel to pivot about a first generally vertical axis at said second edge of said first panel and second pivot means pivotally connecting said second panel to pivot about a second vertical axis at said second edge of said second panel with said second axis spaced from said first axis; said first panel and said second panel pivotable about said first axis and second axis, respectively, between first and second positions, said module assuming said prismatic shape when both of said panels are pivoted to said first position, and said module assuming an open shape exposing said interior when said panels are pivoted away from one another to said second position; and
   electrical connector means disposed on at least one of said first and second panel means receiving a first plurality of electrical condutors extending through at least one of said opening from said chamber and electrically connecting said first plurality of electrical connectors with a second plurality of electrical connectors extending exterior of said chamber.

7. A wire distribution apparatus according to claim 6 comprising a plurality of said termination modules disposed on said frame in side-by-side relation with connecting means releasably and rigidly connecting one of said first and second panels of one of said modules to an opposing one of first and second panels of an adjacent module with said one of said first and second panels in said second position and with said opposing one of said first and second panels in said first position.

8. A wire distrubution apparatus according to claim 6 comprising means releasably rigidly connecting one of said first and second panels in the second position to said frame.

9. A wire distribution apparatus according to claim 7 wherein said connecting means comprises a tie bar of predetermined length and retaining means disposed on said first and second panels, said retaining means aligned to receive said tie bar to retain one of said first and second panels in said second position in rigid spaced relation from said opposing one of said first and second panels of said adjacent module.

10. A wire distribution apparatus according to claim 6 comprising retention means carried by at least one of said panels to retain a cable of said first plurality of electrical connectors with said cable traveling with at least one of said panels.

* * * * *

UNITED STATES PATENT AND TRADEMARK OFFICE
CERTIFICATE OF CORRECTION

PATENT NO. : 4,747,020

DATED : May 24, 1988

INVENTOR(S) : Patrick Brickley, et al.

It is certified that error appears in the above-identified patent and that said Letters Patent is hereby corrected as shown below:

Column 1, line 15, delete "minals";

Column 2, line 9, "panel" should be --panels--;

Column 2, line 43, delete "and";

Column 2, line 46, "cahle" should be --cable--;

Column 2, line 61, "cahle" should be --cable--;

Column 3, line 16, "opposing" should be --Opposing--;

Column 3, line 17, delete "tical plates 40 of adjacent acces";

Column 3, line 30, "dare" should be --are--;

Column 4, line 5, delete "lines";

UNITED STATES PATENT AND TRADEMARK OFFICE
CERTIFICATE OF CORRECTION

PATENT NO. : 4,747,020

DATED : May 24, 1988

INVENTOR(S) : Patrick Brickley, et al.

It is certified that error appears in the above-identified patent and that said Letters Patent is hereby corrected as shown below:

Column 4, line 19, "blends" should be --bends--;

Column 4, line 22, "bands" should be --bends--;

Column 4, line 51, delete "surfaces";

Column 6, line 50, after "tab" should be --by--;

Column 6, lines 50 and 51, "placing the such as 181" should be --placing the cable such as cable 181--;

Column 6, line 59, "2 the" should be --2, the--;

Column 7, line 55, "condutors" should be --conductors--;

UNITED STATES PATENT AND TRADEMARK OFFICE
CERTIFICATE OF CORRECTION

PATENT NO. : 4,747,020

DATED : May 24, 1988

INVENTOR(S) : Patrick Brickley, et al.

It is certified that error appears in the above-identified patent and that said Letters Patent is hereby corrected as shown below:

Column 7, line 60, "a opposing" should be --an opposing--;

Column 8, line 3, "remaining" should be --retaining--;

Column 8, line 4, "reatining" should be --retaining--;

Column 8, line 49, "opening" should be --openings--; and

Column 8, line 62, "distrubution" should be --distribution--.

Signed and Sealed this

First Day of November, 1988

*Attest:*

DONALD J. QUIGG

*Attesting Officer*   *Commissioner of Patents and Trademarks*